United States Patent
Geyer

(10) Patent No.: US 7,344,807 B2
(45) Date of Patent: Mar. 18, 2008

(54) GASSING-FREE EXPOSURE MASK

(75) Inventor: Stefan Geyer, Dresden (DE)

(73) Assignee: Infineon Technologies AG, Munich (DE)

( * ) Notice: Subject to any disclaimer, the term of this patent is extended or adjusted under 35 U.S.C. 154(b) by 421 days.

(21) Appl. No.: 10/843,669

(22) Filed: May 12, 2004

(65) Prior Publication Data
US 2005/0158635 A1    Jul. 21, 2005

(30) Foreign Application Priority Data
May 13, 2003 (DE) ............... 103 21 278

(51) Int. Cl.
*G03F 1/00* (2006.01)
(52) U.S. Cl. .................................. 430/5
(58) Field of Classification Search ............. 430/5; 428/14, 420
See application file for complete search history.

(56) References Cited
U.S. PATENT DOCUMENTS
6,055,040 A    4/2000 Sego
6,264,773 B1 *  7/2001 Cerio .................. 156/64
6,548,176 B1 *  4/2003 Gwo .................. 428/420
2002/0098420 A1  7/2002 Eynon

FOREIGN PATENT DOCUMENTS
DE    102 33 424 A1    2/2003

OTHER PUBLICATIONS
Examination Report dated Jun. 10, 2005, directed to a counterpart foreign application.

* cited by examiner

*Primary Examiner*—S. Rosasco
(74) *Attorney, Agent, or Firm*—Patterson & Sheridan, L.L.P.

(57) ABSTRACT

The present invention relates to an exposure mask for structuring a photoresist layer on a substrate wafer, in which an inorganic adhesive is used as an adhesive device for connecting a reticle having a lithographic structure, a frame and a pellicle. For chemical reasons, an adhesive of this type has no tendency or a considerably lower tendency to gassing out than an organic adhesive used in conventional exposure masks, so that the risk of particles which are deposited on the lithographic structure and which can cause projection errors during an exposure process is largely ruled out. The invention relates further to a method of producing such an inorganic adhesive and also a method of producing an exposure mask with the aid of such an inorganic adhesive.

12 Claims, 3 Drawing Sheets

GASSING-FREE EXPOSURE MASK

CLAIM FOR PRIORITY

This application claims the benefit of priority to German Application No. 103 21 278.7-51, filed in the German language on May 13, 2003, the contents of which are hereby incorporated by reference.

TECHNICAL FIELD OF THE INVENTION

The present invention relates to an exposure mask, and in particular, to an exposure mask in which an inorganic adhesive is used as an adhesive device for connecting a reticle, a frame and a pellicle. The invention relates further to a method for producing such an inorganic adhesive and a method for producing an exposure mask with the aid of such an inorganic adhesive.

BACKGROUND OF THE INVENTION

In order to implement highly integrated electrical circuits with small structure dimensions, lithographic structuring methods are normally used. In this case, a radiation-sensitive photoresist layer is applied to the surface of a semiconductor substrate wafer to be structured and is exposed through an exposure mask with the aid of electromagnetic radiation. In what is known as photolithography, ultraviolet light is used in the process. During the exposure procedure, a lithographic structure arranged on the exposure mask is projected onto the photoresist layer and, with the aid of subsequent etching processes, is transferred into the photoresist layer and the semiconductor layer located underneath.

Known exposure masks comprise a transparent carrier plate, designated a reticle, on which the lithographic structure is arranged as a structured chromium layer. During the exposure process, this structure is projected onto the photoresist layer of the substrate wafer either on a scale of 1:1 or, as in the reducing projection exposure which is familiar nowadays, in a ratio of, for example, 5:1 with the aid of an optical lens system. The reducing projection exposure permits the production of very small structures.

In order to avoid projection errors, which can be caused by particles accidentally deposited on the lithographic structure, a thin transparent membrane, designated a pellicle, is used which, with the aid of a frame arranged on the reticle, is clamped on at a defined distance from the lithographic structure, so that the lithographic structure is sealed. The encapsulating structure of the exposure mask ensures that individual particles from the surroundings of the exposure mask could not be deposited directly on the lithographic structure at the optical focus and could not then disrupt the exposure process.

The resolving power of an exposure method, and therefore the achievable size of the semiconductor structures, is limited by the wavelength of the radiation used. In the course of miniaturization of these structures, constantly required in the semiconductor industry, smaller and smaller exposure wavelengths are being used. Because of a wavelength-dependent transparency of the components of the exposure mask, novel materials are also used for smaller exposure wavelengths.

For an exposure wavelength of 436 nm, the reticle consists of normal glass and, for wavelengths of 365 nm, 248 nm and 193 nm, and for the wavelength of 157 nm to be used in the future, the reticle consists of quartz glass.

For wavelengths of 436 nm and 365 nm, the pellicle is a cellulose nitrate film and, for wavelengths of 248 nm and 193 nm, the pellicle is a fluoropolymer film. These pellicles consisting of organic materials are also designated a "soft pellicle". However, since a fluoropolymer film exhibits photochemical aging processes at an exposure wavelength of 193 nm, it is more beneficial, at this wavelength and in particular at the still higher-energy wavelength of 157 nm, to use a thin quartz glass sheet as a pellicle. A pellicle of this type is also called a "hard pellicle".

The frame for connecting reticle and pellicle consists of anodized and dyed aluminum at the exposure wavelengths of 436 nm to 193 nm used hitherto. However, for the future exposure wavelength of 157 nm, it is more beneficial to form a frame likewise of quartz glass, in order to avoid projection errors or damage to the pellicle because of sagging in the event of a small temperature change, because of the different thermal expansion coefficients of quartz glass and aluminum.

As an adhesive agent for connecting the reticle, the frame and the pellicle, in the case of exposure masks for the exposure wavelengths of 436 nm to 193 nm used hitherto, organic adhesives, predominantly acrylates are used. However, in the case of these organic compounds, there is the problem that they tend to gas out and, as a result, in spite of the sealing achieved with the aid of the frame and the pellicle, particles can be deposited on the lithographic structure on the reticle. For example, it is possible to imagine that, at higher temperatures, organic molecules will gas out from the adhesive, will be deposited at thermodynamically favored points on the lithographic structure and crystals will grow as a result. Amongst other things, it is also possible that constituents of the air will form crystals on the lithographic structure with gassing of the adhesive.

In addition, it is disadvantageous that these radiation-induced chemical reactions increase, the smaller the exposure wavelength used is, since the radiation energy increases as the wavelength is reduced. In parallel with this, the mask structures are becoming smaller and smaller in the course of the miniaturization of the semiconductor structures and, as a result, are becoming more and more susceptible to deposits on the lithographic structure.

SUMMARY OF THE INVENTION

The present invention provides an exposure mask built up from a reticle, a frame and a pellicle whose components are connected with an adhesive device which exhibits no tendency or a considerably reduced tendency to gassing out.

According to one embodiment of the invention, an exposure mask is proposed which comprises a reticle having a lithographic structure, a frame and a pellicle arranged at a defined distance from the lithographic structure by means of the frame, in which the adhesive device used for connecting reticle, frame and pellicle is an inorganic adhesive. For chemical reasons, an adhesive of this type has no tendency or a considerably lower tendency to gas out than an organic adhesive, so that the risk of particles deposited on the lithographic structure is largely ruled out.

The reticle, the frame and the pellicle of the exposure mask preferably includes quartz glass and are connected with an inorganic adhesive of the waterglass type, which includes at least the elements silicon, oxygen and an alkali metal. Such an exposure mask built up completely from inorganic quartz glass components is, as explained above, particularly suitable for an exposure wavelength of 157 nm. Since the components are comprised of the same material, no problems caused by different thermal expansions arise. The adhesive of the waterglass type achieves good adhesive strengths on the quartz glass components and may be produced simply and economically. Furthermore, for chemical reasons, gassing out is ruled out completely in the case of an adhesive of this type.

In an advantageous embodiment of the exposure mask, a potassium silicate solution is used as the adhesive device. An adhesive device of this type does not tend to effloresce, by contrast with, for example, a sodium silicate solution.

According to another embodiment of the invention, the use of an inorganic adhesive as an adhesive device for joining a reticle, a frame and a pellicle of an exposure mask is also proposed, the reticle having a lithographic structure and the pellicle being arranged at a defined distance from the lithographic structure by means of the frame. Accordingly, by means of the use of an adhesive device of this type, which has no tendency or a considerably lower tendency to gassing out than an organic adhesive, the risk of particles deposited on the lithographic structure is largely ruled out.

In still another embodiment of the invention, there is a method a for producing an inorganic adhesive which is suitable as an adhesive means for connecting a reticle, a frame and a pellicle of an exposure mask. In this case, in a first method step, an inorganic adhesive solution is provided and, in a second method step, this solution is filtered with a first filtering device in order to remove organic traces which can cause gassing out. Then, in a third method step, the solution is filtered with a second filtering device in order to remove particles. With the aid of this method, which in particular can even be carried out with commercially available adhesive solutions, a gassing-free inorganic adhesive can be produced simply and with little expenditure.

In the embodiment which is preferred for practical use, the filtering of the solution with a first filtering device is carried out by shaking the solution with active carbon, by which means organic components of the solution can be removed very reliably.

In yet another embodiment, there is a method for producing an exposure mask comprising a reticle which has a lithographic structure, a frame and a pellicle arranged at a defined distance form the lithographic structure by means of the frame, the reticle, the frame and the pellicle being connected by means of an inorganic adhesive. In this case, in a first method step, the inorganic adhesive is applied to a first side of the frame and/or to side of the pellicle facing the frame and, in a second method step, the corresponding sides of the frame and of the pellicle to be bonded are joined to each other. Then, in a third method step, the inorganic adhesive is applied to a second side of the frame and/or to a side of the reticle provided with the lithographic structure, in a fourth method step, the corresponding sides of the frame and of the reticle to be bonded are joined to each other and then, in a fifth method step, the inorganic adhesive is dried. With the aid of this method, an exposure mask without any tendency or with a considerably lower tendency to gassing out can be produced.

After the second method step, additional drying of the adhesive is preferably carried out, in order to minimize the components which emerge during a drying process and which can also emerge in the region enclosed by reticle, frame and pellicle.

BRIEF DESCRIPTION OF THE DRAWINGS

The invention will be explained in more detail in the following text using the figures, in which.

DETAILED DESCRIPTION OF THE INVENTION

Figure 1:
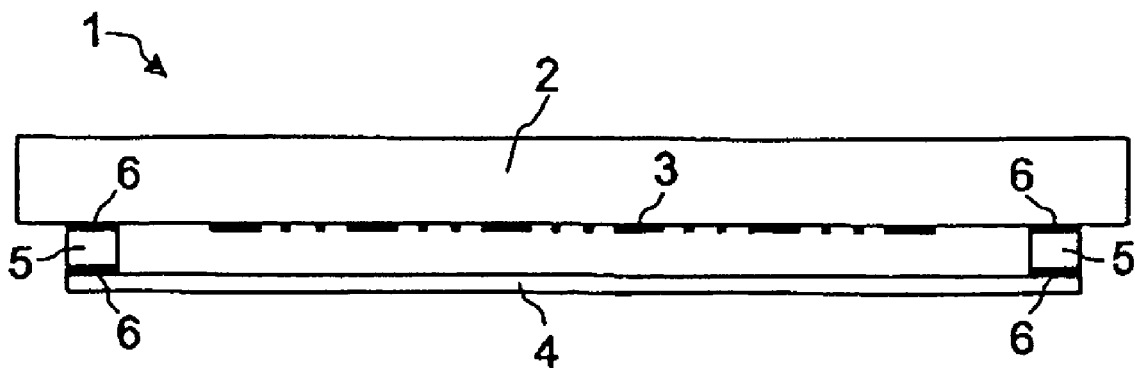
FIG. 1 shows a schematic sectional illustration of an exposure mask according to the invention from the side.

FIG. 1 shows a schematic sectional illustration of an exposure mask 1 according to the invention from the side. The exposure mask 1 comprises a transparent carrier plate, designated a reticle 2, to the underside of which a lithographic structure 3 is applied. The lithographic structure 3 consists of a chromium layer which, for example, has been structured with the aid of plasma etching processes.

The exposure mask 1 further comprises a thin transparent membrane designated a pellicle 4 and a frame 5, the pellicle 4 being clamped on at a defined distance from the lithographic structure 3 with the aid of the frame 5. By means of this three-part construction of the exposure mask 1, sealing of the lithographic structure 3 is achieved, so that projection errors, which can be caused by particles from the surroundings accidentally deposited on the lithographic structure 3, are avoided.

During an exposure process, in which electromagnetic radiation from above is radiated through the transparent reticle 2 and the transparent pellicle 4, the lithographic structure 3 is projected onto a photoresist layer applied to a substrate wafer underneath the exposure mask 1. In this case, the lithographic structure 3 can be projected onto the photoresist layer either on a scale of 1:1 or, as in the case of a reduced projection exposure, reduced in a ratio of, for example, 5:1, with the aid of a reducing optical lens system. By means of subsequent etching processes, this structure is then transferred into the photoresist layer and the semiconductor layer located underneath.

The reticle 2, the frame 5 and the pellicle 4 in each case consist of quartz glass, so that the exposure mask 1 built up from these components is suitable for an exposure wavelength of 193 nm and in particular for the exposure wavelength of 157 nm used in the future. Furthermore, no problems caused by different thermal expansions result, such as damage to the pellicle 4, since the components consist of the same material.

As an adhesive device for connecting reticle 2, frame 5 and pellicle 4, an inorganic adhesive 6 is used. For chemical reasons, an adhesive of this type exhibits little or no tendency or a considerably lower tendency to gassing out than an organic adhesive used in conventional exposure masks, so that the risk of particles deposited on the lithographic structure 3, which can cause projection errors during an exposure process, is largely ruled out.

The inorganic adhesive 6 is preferably an adhesive of the waterglass type which contains at least the elements silicon, oxygen and an alkali metal. An adhesive of this type is distinguished by a good adhesive strength on the quartz glass components of the exposure mask 1 and may be produced simply and economically. The use of a potassium silicate solution which, as opposed to, for example, sodium silicate solution, does not tend to effloresce, is particularly advantageous.

Figure 2:
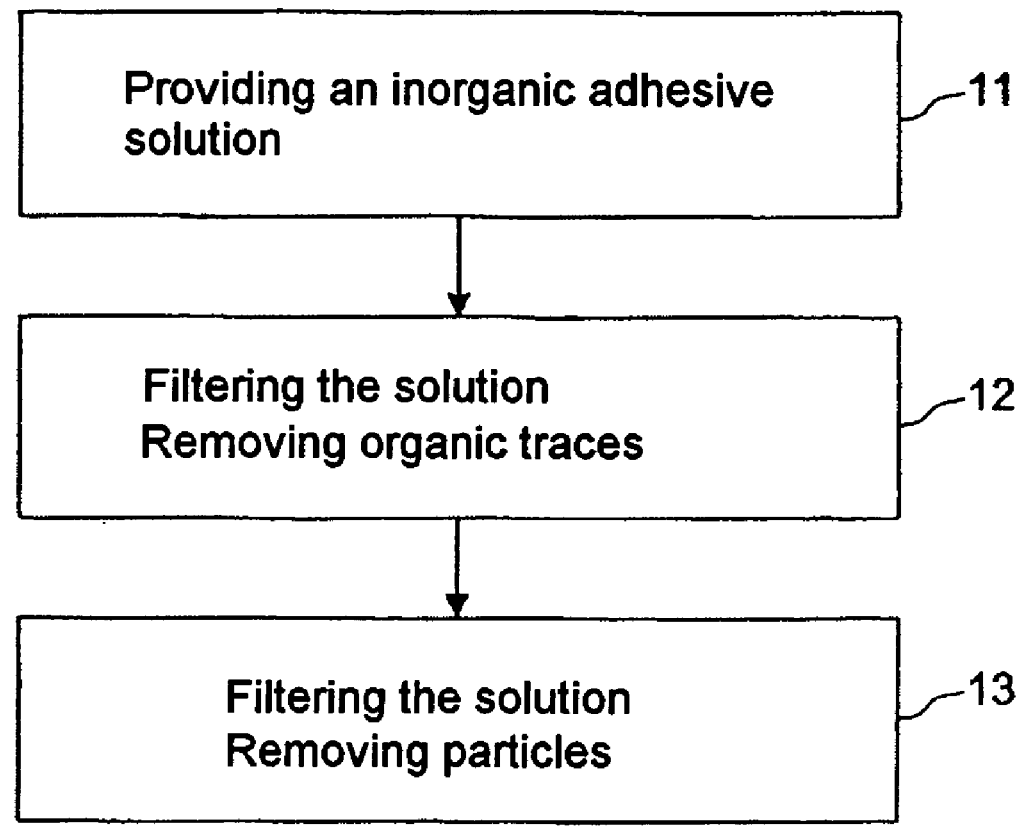
FIG. 2 shows a flow chart of a method according to the invention for producing an inorganic adhesive.

FIG. 2 shows a flow chart of a method according to the invention for producing an inorganic adhesive which is suitable for use as an adhesive device in the exposure mask 1 illustrated in FIG. 1. In this case, in a first method step 11, an inorganic adhesive solution is provided. Then, in a second method step 12, this solution is filtered with a first filtering device in order to remove organic traces which can cause gassing out. The removal of organic constituents of the solution can in this case be carried out very reliably by shaking the solution with active carbon.

Following that, in a third method step 13, the inorganic adhesive solution is filtered with a second filtering device, in order to remove coarser particles from the solution and thus to obtain a homogeneous adhesive solution. By means of such an adhesive solution, homogeneous adhesive compounds free of lumps can be achieved.

In order to obtain a most homogeneous adhesive solution, this third method step 13 is preferably carried out in two part steps. In a first part step, the solution is first freed of coarse particles by filtering the solution over a filter with a pore size of 5 μm, and subsequently of finer particles by filtering the solution under clean room conditions over a filter with a pore size of 0.1 μm.

Figure 3:
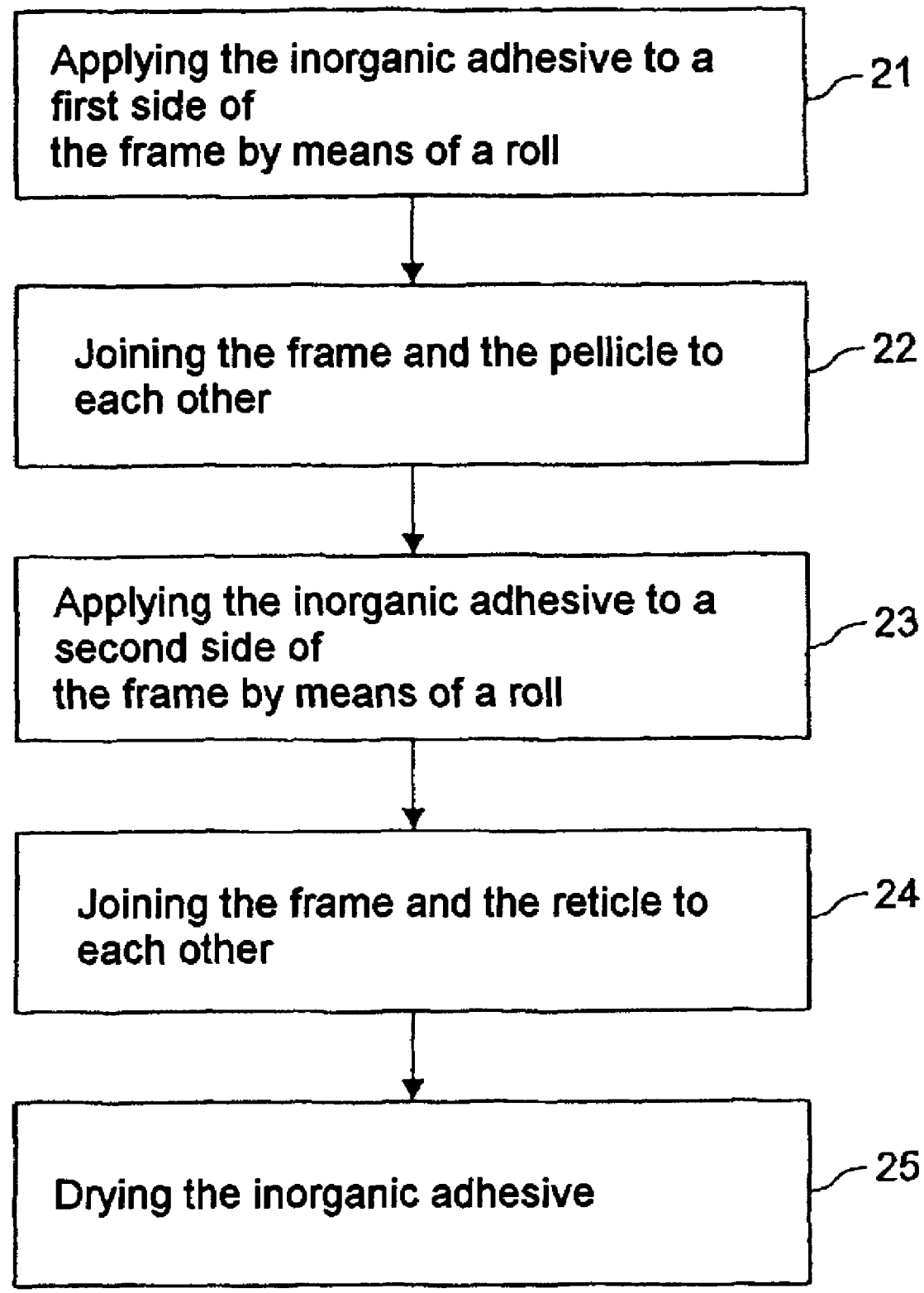
FIG. 3 shows a flow chart of a first embodiment of a method according to the invention for producing the exposure mask illustrated in FIG. 1.

FIG. 3 shows a flow chart of a first embodiment of a method according to the invention for producing the exposure mask 1 illustrated in FIG. 1. In this case, in a first method step 21, the inorganic adhesive is applied to a first side of the frame with the aid of a roll. One important precondition is that the areas to which the inorganic adhesive is applied are clean and have previously been degreased or cleaned as required, in order to achieve a good adhesive strength of the adhesive. The roll used is preferably comprised of cross-linked polyvinyl alcohol, which permits the adhesive to be applied easily to a surface as a thin layer. After that, in a second method step 22, the corresponding sides of the frame and of the pellicle to be bonded are joined to each other.

In a third method step 23, the inorganic adhesive is applied to a second side of the frame and then, in a fourth method step 24, the corresponding sides of the frame and of the reticle to be bonded are joined to each other.

After a subsequent fifth method step 25, in which the inorganic adhesive is dried, reticle, frame and pellicle are firmly connected to one another, so that the exposure mask can be used for exposure processes. If a potassium silicate solution is used as inorganic adhesive, the drying of the adhesive is preferably carried out at a temperature of 23° C. and with an atmospheric humidity of 38%. Under these conditions, the drying process of the adhesive lasts about 24 hours.

Figure 4:
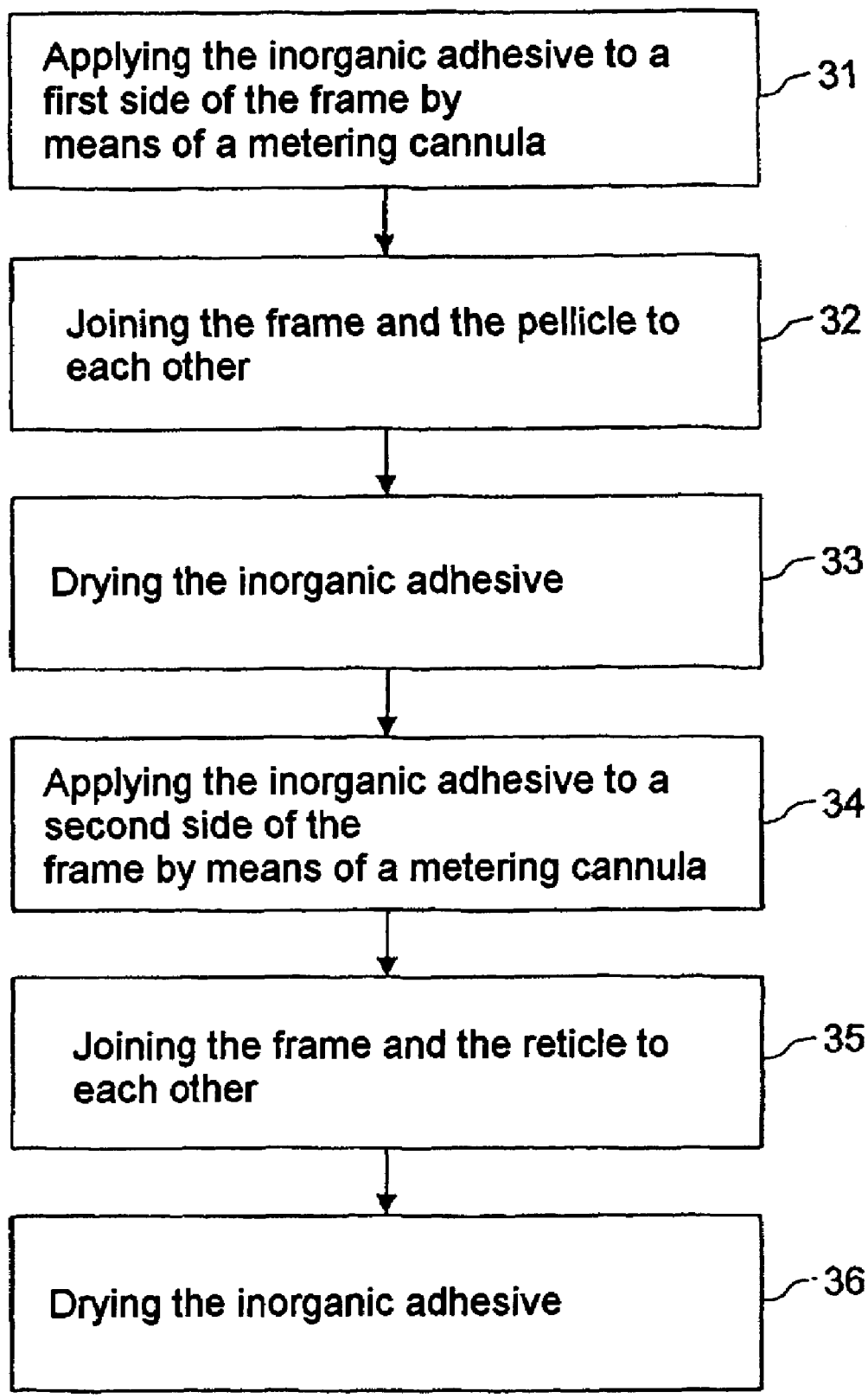
FIG. 4 shows a flow chart of a second embodiment of a method according to the invention for producing the exposure mask illustrated in FIG. 1.

Alternatively, a second embodiment of a method according to the invention for producing the exposure mask illustrated in FIG. 1 can be carried out, of which the flow chart is illustrated in FIG. 4. In this case, in a first method step 31, the inorganic adhesive is applied to a first side of the frame with a metering cannula and then, in a second method step 32, the corresponding surfaces of the frame and of the pellicle to be bonded are joined to each other. The inorganic adhesive may be applied more precisely to the surface with a metering cannula as opposed to a roll.

Following that, in a third method step 33, the inorganic adhesive is dried before, in a fourth method step 34, the adhesive is applied with the metering cannula to a second side of the frame, the corresponding sides of the frame and of the reticle to be bonded are joined to each other in a fifth method step 35, and the adhesive is again dried in a sixth method step 36.

The additional drying of the adhesive in the third method step 33, as compared with the method illustrated in FIG. 3, has the advantage that components which emerge during a drying process and which can also emerge in the region enclosed by reticle, frame and pellicle are minimized.

Instead of the previously described embodiment of a method according to the invention for producing an exposure mask, further embodiments can be imagined which represent combinations of the methods illustrated in FIG. 3 and FIG. 4. For instance, in the methods shown in FIG. 4, the application of the inorganic adhesive could also be carried out with a roll instead of the metering cannula. Optionally, embodiments are also conceivable in which first of all frame and reticle are joined to each other and then frame and pellicle are joined to each other, or in which all three components are joined to one another simultaneously. In addition, the inorganic adhesive can additionally or exclusively be applied to the surfaces of reticle and pellicle to be bonded.

What is claimed is:

1. An exposure mask for structuring a photoresist layer on a substrate wafer, comprising:
   a reticle which has a lithographic structure;
   a frame; and
   a pellicle arranged at a defined distance from the lithographic structure by the frame;
   the reticle, the frame and the pellicle each comprising quartz glass and being connected by an adhesive device comprising an inorganic adhesive.

2. The exposure mask as claimed in claim 1, wherein the inorganic adhesive of the adhesive device is of the waterglass type which includes at least the elements silicon, oxygen and an alkali metal.

3. The exposure mask as claimed in claim 2, wherein the adhesive device used is a potassium silicate solution.

4. Use of an inorganic adhesive as an adhesive for connecting a reticle, a frame and a pellicle of an exposure mask, wherein the reticle, the frame and the pellicle comprise quartz glass; the reticle having a lithographic structure and the pellicle being arranged at a defined distance from the lithographic structure by the frame.

5. The use of an inorganic adhesive as claimed in claim 4, wherein the inorganic adhesive is of a waterglass type which includes at least the elements silicon, oxygen and an alkali metal.

6. The use of an inorganic adhesive as claimed in claim 5, wherein the adhesive is a potassium silicate solution.

7. A method of producing an exposure mask comprising a reticle which has a lithographic structure, a frame and a pellicle, wherein the pellicle is arranged at a defined distance from the lithographic structure by the frame; and wherein the reticle, the frame and the pellicle each comprise quartz glass and are connected by an inorganic adhesive, the method comprising:
   a) applying the inorganic adhesive to at least one of a first side of the frame and a side of the pellicle that faces the frame;
   b) joining the first side of the frame and the side of the pellicle that faces the frame;
   c) applying the inorganic adhesive to at least one of a second side of the frame and a side of the reticle provided with the lithographic structure;
   d) joining the first side of the frame and the side of the reticle that faces the frame; and
   e) drying the inorganic adhesive.

8. The method as claimed in claim 7, wherein drying of the inorganic adhesive is carried out between steps b) and c).

9. The method as claimed in claim 7, wherein the application of the inorganic adhesive is carried out with a roll.

10. The method as claimed in claim 7, wherein the application of the inorganic adhesive is carried out with a metering cannula.

11. The method as claimed in claim 7, wherein the inorganic adhesive is of a waterglass type which includes at least elements silicon, oxygen and an alkali metal.

12. The method as claimed in claim 11, wherein the adhesive used is a potassium silicate solution and the drying of the adhesive is carried out at a temperature of 23° C. and with an atmospheric humidity of 38%.

* * * * *